(12) United States Patent
Theuwissen

(10) Patent No.: US 7,764,315 B2
(45) Date of Patent: Jul. 27, 2010

(54) CMOS IMAGING FACILITY AND A MODULAR ARRAY FOR USE IN SUCH A FACILITY

(75) Inventor: Albert Theuwissen, Bree (BE)

(73) Assignee: DALSA Corporation, Waterloo (CA)

( * ) Notice: Subject to any disclaimer, the term of this patent is extended or adjusted under 35 U.S.C. 154(b) by 701 days.

(21) Appl. No.: 11/509,019

(22) Filed: Aug. 24, 2006

(65) Prior Publication Data

US 2008/0049131 A1    Feb. 28, 2008

(51) Int. Cl.
*H04N 3/14* (2006.01)
*H04N 5/335* (2006.01)

(52) U.S. Cl. ...................................... 348/308; 348/294
(58) Field of Classification Search ................. 348/308, 348/294, 302, 315, 316, 320, 322; 250/214
See application file for complete search history.

(56) References Cited

U.S. PATENT DOCUMENTS

| 6,035,077 A | 3/2000 | Chen |
| 6,423,994 B1 | 7/2002 | Guidash |
| 6,452,153 B1 * | 9/2002 | Lauxtermann et al. ... 250/208.1 |
| 6,507,365 B1 * | 1/2003 | Nakamura et al. .......... 348/296 |
| 6,867,806 B1 * | 3/2005 | Lee et al. ..................... 348/308 |
| 6,876,388 B1 | 4/2005 | Lee |
| 6,956,605 B1 * | 10/2005 | Hashimoto ................... 348/301 |
| 6,977,684 B1 * | 12/2005 | Hashimoto et al. .......... 348/294 |
| 7,087,883 B2 * | 8/2006 | He et al. ................. 250/214 R |

* cited by examiner

*Primary Examiner*—David L Ometz
*Assistant Examiner*—Ahmed A Berhan
(74) *Attorney, Agent, or Firm*—Fishen Technology Law PLLC

(57) ABSTRACT

A CMOS imaging facility is implemented on a substrate through a set of pixel circuits that are array-wise organized in lines and columns and each comprise a radiation-to-charge accumulator (20), a transfer transistor (22) for transferring a representation of the charge, a reset transistor (24) fed by a reference voltage and a source follower transistor (26) for feeding a select transistor (28) that feeds the representation to an output array conductor. In particular, for respective pairs of adjacent column conductors the associated pixel transfer transistors will controllably pair wise share the accumulators in an interlace organization.

5 Claims, 4 Drawing Sheets

CMOS IMAGING FACILITY AND A MODULAR ARRAY FOR USE IN SUCH A FACILITY

BACKGROUND OF THE INVENTION

The invention relates to a CMOS imaging facility implemented on a substrate through a set of pixel circuits that are array-wise organized in lines and columns and each comprise a radiation-to-charge accumulator, a transfer transistor for transferring a representation of said charge, a reset transistor fed by a reference voltage and a source follower transistor for feeding a select transistor that feeds said representation to an output array conductor, such as being recited in the preamble of claim 1. It is to be noted that in this application CMOS imaging facility means that the imaging facility is based on CMOS (=Complimentary Metal Oxide Semiconductor) technology or on NMOS technology or on PMOS technology. In CMOS technology both NMOS and PMOS technology is used. This kind of imaging facility has become a predominant technical feature for use by the general public. Generally, the pixels are scanned in a line-wise organization for display, broadcasting or storage. In principle, the usage of the terms lines and columns can hereinafter be interchanged.

Now, a first scanning organization is progressive, wherein the lines are scanned in the order #1, #2, #3, #4, etcetera. A second scanning organization is according to #1, #3, #5, . . . , #2, #4, #6, . . . , #1, etcetera, such as being originally based on the well-known interlaced color television broadcast technology. The odd lines will then constitute a first field of the first frame, then the even lines will constitute the second field of the first frame, and so further for consecutive frames. The above means that normally, between the first field of a frame and the second field of the same frame there is an off-set in time (roughly equal to the field-scanning interval), and also an off-set in vertical position (roughly equal to the width of one scanning line.

Now, the present inventor has recognized that the constituting of each single pixel from the charge accumulation result of two adjacent accumulator elements would raise the resulting signal by a factor of two, which would accordingly increase the signal-to-noise ratio by a relative factor of two, and in doing so to a large degree would inhibit the producing or retaining of unwanted noise and other interferences.

Therefore, according to one of its objects, the invention envisages to systematically join or share the charges accumulated for various pixels thereamongst, for so averaging statistical effects and the like.

SUMMARY TO THE INVENTION

In consequence, amongst other things, it is an object of the present invention to share the charges from adjoining accumulators, for so keeping signal noise at an intrinsically low level, whilst at the same time maintaining circuit complexity at minimum. A particular application of the invention is where the device fed by the array could either have, or have no interlacing organization among successive pixel rows. The advantages of both interlacing and also non-interlacing for display and storage of images have been generally acknowledged.

Now therefore, according to one of its aspects, the invention is characterized according to the characterizing part of claim 1.

Advantageously, for a particular array column conductor said sharing at opposite sides thereof is staggered over one pixel position. Such arrangement realizes the full advantages of the invention's progress. Further advantageous aspects of the invention are recited in dependent Claims.

By itself, U.S. Pat. No. 6,867,806 B1 to Lee and Wayne in FIG. 5 discloses the accessing of all array rows twice for each frame, so 1+2, 3+4, 5+6, etcetera for the odd field, 2+3, 4+5, 6+7, etcetera for the even field. In contradistinction, for respective pairs of adjacent column conductors in the present invention the associated pixel transfer transistors will controllably pair wise share said accumulators in an interlace organization. The present invention operates on the combination of two adjacent column conductors. The reference is periodical on the level of a single column conductor. The present inventor has found the improved geometry better applicable from the viewpoints of control technology and circuit integration.

BRIEF DESCRIPTION OF THE DRAWING

These and further features, aspects and advantages of the invention will be discussed more in detail hereinafter with reference to the disclosure of preferred embodiments of the invention, and in particular with reference to the appended Figures that illustrate.

DETAILED DESCRIPTION OF PREFERRED EMBODIMENTS

Figure 1:
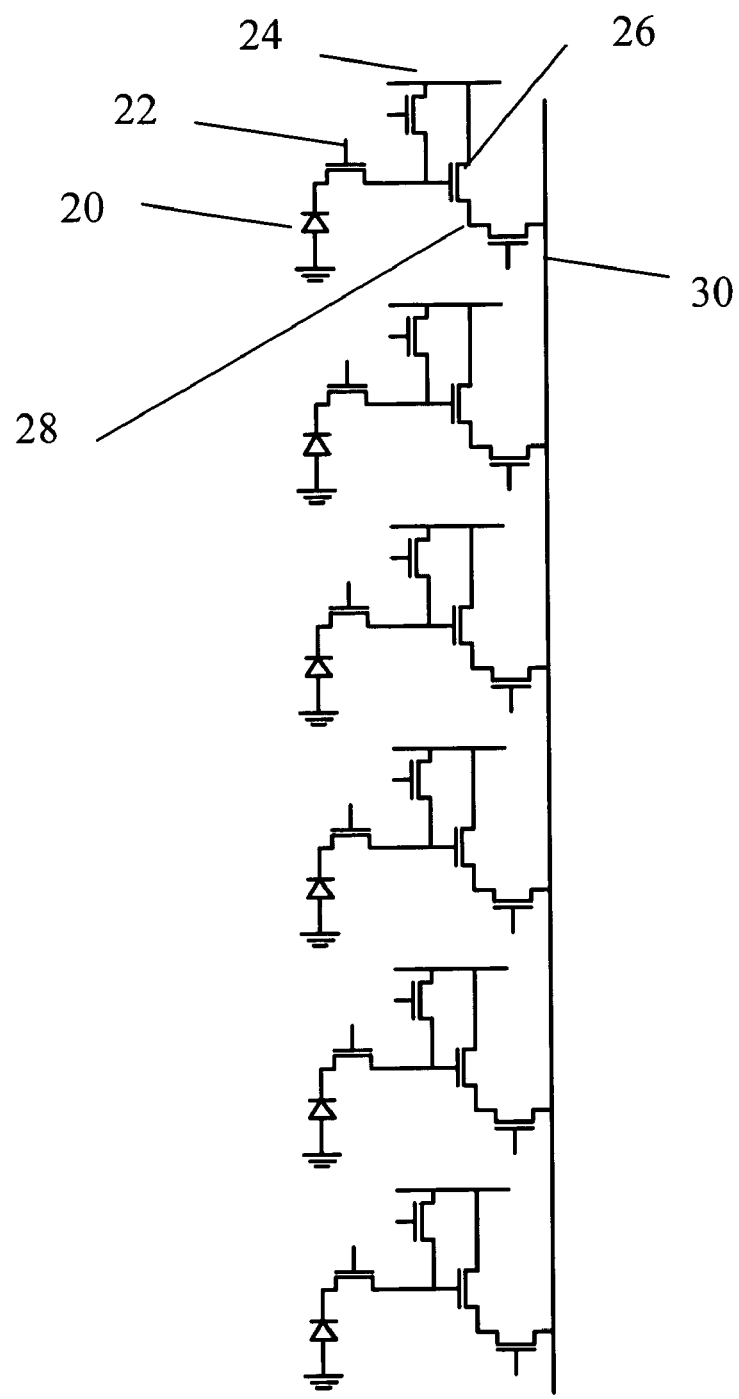
FIG. 1, a CMOS imaging arrangement based on one-column conductor.

FIG. 1 illustrates a CMOS imaging arrangement based on one-column conductor. For brevity, the semiconductor substrate, the horizontal or row conductors, and various other prior art elements have not been disclosed as being standard technology for those skilled in the art. In the Figure, six pixels have been shown along a single vertical or column conductor 30. The topmost circuit module comprises charge accumulating diode 20, reset transistor 24 that is connected to a reference voltage not detailed further, source follower transistor 26, and select transistor 28 that can output a pixel charge representation to column conductor line 30. Generally, the source follower translates the accumulated charge to a voltage. Furthermore, control transistor 22 will enable the accumulated charge to flow towards the output circuit of the module as represented in principle by transistors 26 and 28. For brevity, the other five pixels have not been given corresponding numerals inasmuch as they are identical to the topmost accumulator as discussed. The organization as shown lends itself to a progressive scanning organization.

Figure 2:
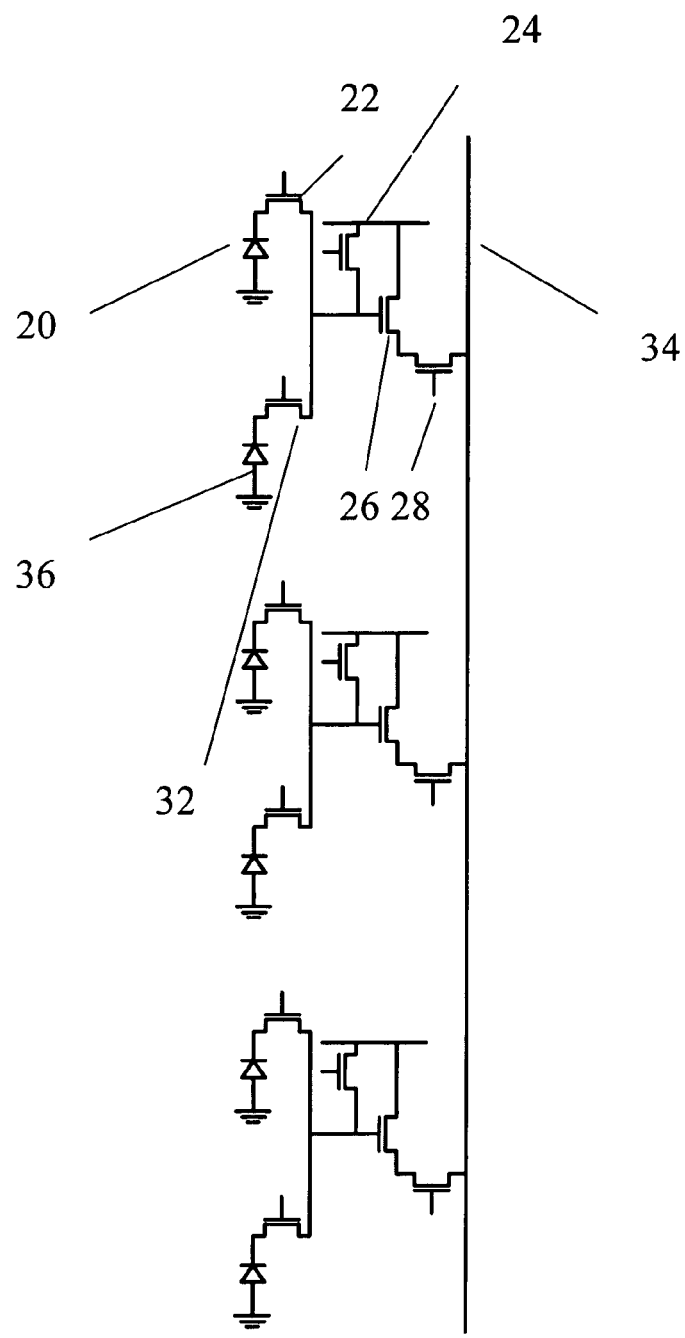
FIG. 2, a CMOS imaging arrangement based on one column conductor with vertical sharing.

FIG. 2 illustrates a CMOS imaging arrangement based on one column conductor with vertical sharing. Generally, corresponding circuit elements have been assigned corresponding reference numerals. Incidentally corresponding circuit elements have been contrasted by assigning different reference numerals. For one, the arrangement of the topmost accumulator in FIG. 1 has been copied with circuit elements 20 through 28. Furthermore, the next lower accumulator along the vertical conductor 34, has charge accumulator 36, and select/control transistor 32 that corresponds to transistor 22. In this manner, the arrangement of FIG. 2 has two modes of operation. According to the first mode, accumulators 20, 36 are sensed in alternation. According to the second mode, accumulators 20, 36 are sensed in combination. Therefore, in this arrangement the first mode has twice as many image rows as the second, so that the first can in principle be used for a progressive scan and display. In the combining mode, the charges effectively accumulated are shared, so that random deviations will combine to a lower eventual noise or deviation figure, and can be used for an interlaced scan and display.

Figure 3:
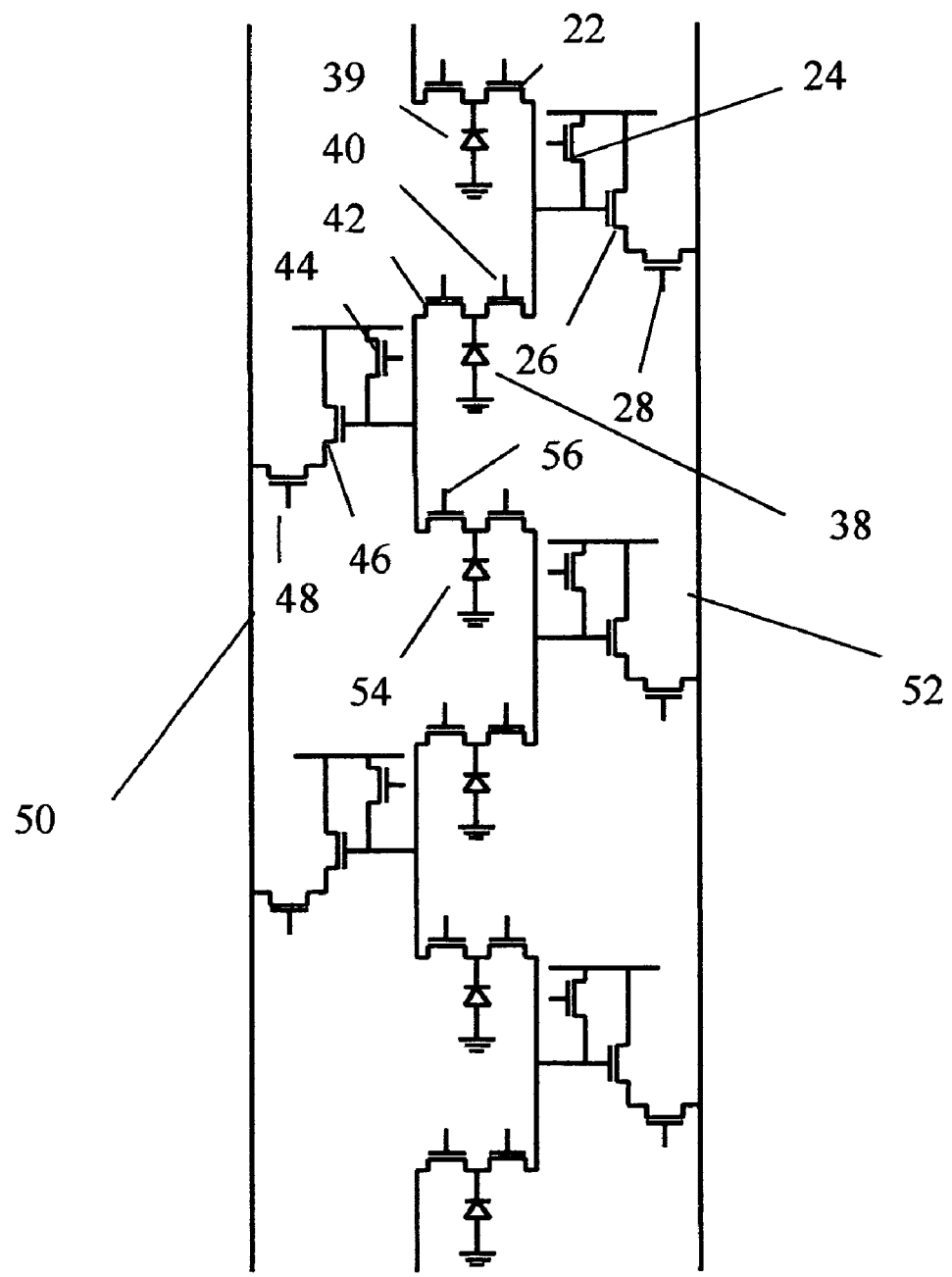
FIG. 3, a CMOS imaging arrangement based on two column conductors with horizontal demultiplexing.

FIG. 3 illustrates a CMOS imaging arrangement based on two column conductors with horizontal demultiplexing. Again, the arrangement of the topmost accumulator in FIG. 1 has been copied with circuit elements 22 through 28 and charge accumulator element 39. A next lower charge accumulator element 38 can by means of control transistor 40 be connected to the same circuit elements as accumulator 39. This means that both of them can feed vertical line 52, for noiseless adding of their accumulated charges. On the other hand, charge accumulator element 38, by means of a mirrored circuit of transistors 42, 44, 46, 48 can feed the other vertical conductor 50 in the Figure. Just like charge accumulator elements 38 and 39 can have their charges added for forwarding to line 52, charge accumulator elements 38 and 54 can have their charges added for forwarding to line 50. The addition of charges staggers in the vertical direction in the Figure, when going from line 50 to line 52 and vice versa. At a price of an extra transistor per accumulator element (such as both 40, 42 instead of only a single one), both combined and also separated charge outputting to the vertical lines is now enabled.

Figure 4:
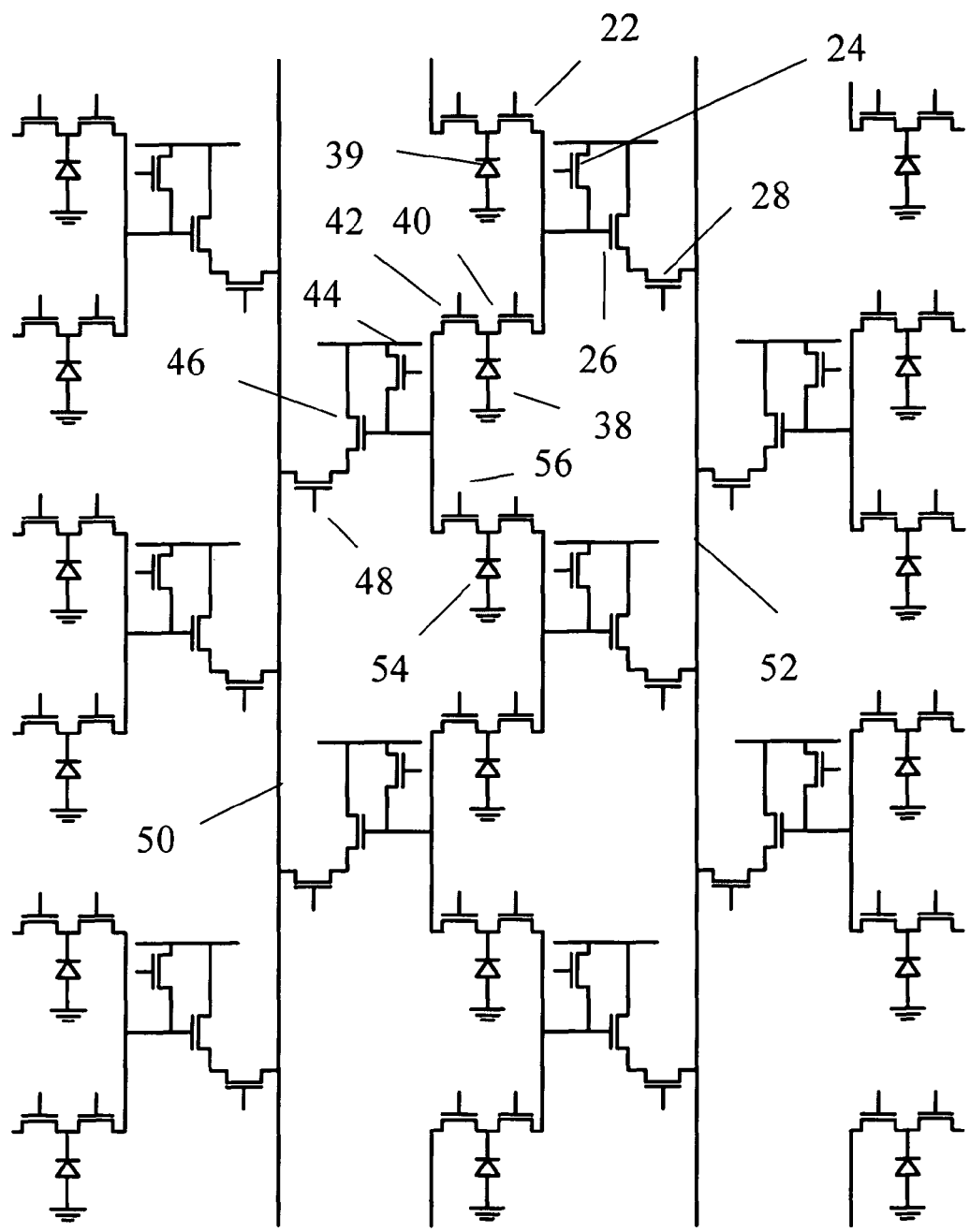
FIG. 4, a CMOS imaging arrangement based on multiple column conductors with staggered vertical sharing and horizontal demultiplexing.

FIG. 4 illustrates a CMOS imaging arrangement based on multiple column conductors with staggered vertical sharing and horizontal demultiplexing. Moreover, each column conductor is used twice, both for the charge sharing at its left hand side, and also for those at its right hand side. For simplicity, generally only the reference numerals from FIG. 3 have been copied. The arrangement at the left hand side of vertical line 50, and also at the right hand side of vertical conductor 52 have been identically copied from the region between those two vertical conductors. In consequence, conductor 50 combines accumulators 38 and 54, whereas conductor 52 combines accumulators 38 and 39. The circuit arrangement is periodic both in the column direction and also in the row direction.

Various aspects of the invention are worth mentioning. Through the interlacing, the integration times of the charge accumulation will overlap among the odd and even lines. For interlacing, this implies interlacing in the electric charge domain. As a particular advantage, the combining of an even row of charge accumulators and an odd row of charge accumulators will produce sharper pixels and/or more prominent pixels. Finally, after executing the transfer of the image to the output conductors (here, generally, column conductors) the overall reset is effected on the basis of a complete frame.

Now, the present invention has hereabove been disclosed with reference to preferred embodiments thereof. Persons skilled in the art will recognize that numerous modifications and changes may be made thereto without exceeding the scope of the appended Claims. In consequence, the embodiments should be considered as being illustrative, and no restriction should be construed from those embodiments, other than as have been recited in the Claims.

The invention claimed is:

1. A CMOS imaging device comprising a pair of column conductors, an accumulator column disposed between the pair of column conductors, a left sharing circuit column coupled between the accumulator column and a left column conductor of the pair of column conductors, and a right sharing circuit column coupled between the accumulator column and a right column conductor of the pair of column conductors, wherein:

the accumulator column comprises an odd sub-array of horizontal duplex accumulators and an even sub-array of horizontal duplex accumulators interleaved with the odd sub-array;

the odd sub-array includes a first horizontal duplex accumulator;

the even sub-array includes second and third horizontal duplex accumulators, the second and third horizontal duplex accumulators being different from one another;

each horizontal duplex accumulator comprises a radiation-to-charge accumulator and left and right transfer transistors coupled to one another at a connection point, the radiation-to-charge accumulator being coupled to the connection point, the transfer transistors being for transferring a representation of a charge collected on the radiation-to-charge accumulator;

the left sharing circuit column comprises plural vertical sharing circuits;

the right sharing circuit column also comprises plural vertical sharing circuits;

each vertical sharing circuit comprises a reset transistor fed by a reference voltage and a source follower transistor for feeding a select transistor that feeds said representation of a collected charge to a column conductor, the reset transistor being connected to the source follower transistor at a node;

the plural vertical sharing circuits of the left sharing circuit column includes a first vertical sharing circuit;

the plural vertical sharing circuits of the right sharing circuit column includes a second vertical sharing circuit;

a left transfer transistor of the first horizontal duplex accumulator is coupled both to a left transfer transistor of the second horizontal duplex accumulator and to the node of the first vertical sharing circuit; and a right transfer transistor of the first horizontal duplex accumulator is coupled both to a right transfer transistor of the third horizontal duplex accumulator and to a node of the second vertical sharing circuit.

2. A CMOS imaging device according to claim 1, wherein:

a kernel of the device comprises the right sharing circuit column, the accumulator column, the left sharing circuit column, and the left column conductor of the pair of column conductors; and the kernel repeats periodically along a direction defined to the left of the left column conductor.

3. A CMOS imaging device according to claim 1, further comprising a first additional accumulator column and an additional right sharing circuit column coupled between the first additional accumulator column and the left column conductor of the pair of column conductors.

4. A CMOS imaging device according to claim 3, wherein:

the first additional accumulator column and the additional right sharing circuit column are disposed on an opposite side of the first column conductor of the pair of column conductors from the left sharing circuit column; and individual horizontal duplex accumulators of the first additional accumulator column and individual vertical sharing circuits of the additional right sharing circuit column are staggered vertically with respect to counterparts in the left sharing circuit column and the accumulator column by a vertical accumulator position.

5. A CMOS imaging device according to claim 3, further comprising a second additional accumulator column and an additional left sharing circuit column coupled between the second additional accumulator column and the right column conductor of the pair of column conductors.

* * * * *